(12) United States Patent
Yamaguchi et al.

(10) Patent No.: US 7,952,888 B2
(45) Date of Patent: May 31, 2011

(54) WIRING MODULE (75) Inventors: Nobuhito Yamaguchi, Tokyo (JP); Yuji Tsuruoka, Kawasaki (JP); Takashi Mori, Tokyo (JP); Masao Furukawa, Yokohama (JP); Seiichi Kamiya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1035 days.

(21) Appl. No.: 11/797,115

(22) Filed: May 1, 2007

(65) Prior Publication Data
US 2007/0286946 A1    Dec. 13, 2007

(30) Foreign Application Priority Data
May 9, 2006 (JP) ................................. 2006-130793

(51) Int. Cl.
*H01R 9/00* (2006.01)
(52) U.S. Cl. ........ 361/776; 361/765; 361/790; 361/794; 361/795
(58) Field of Classification Search .......... 361/761–766, 361/778, 794–795
See application file for complete search history.

(56) References Cited

U.S. PATENT DOCUMENTS

| 5,262,719 | A  | * | 11/1993 | Magdo | 324/158.1 |
| 5,707,459 | A  |   | 1/1998  | Itoyama et al. | 136/251 |
| 6,456,502 | B1 | * | 9/2002  | Miller et al. | 361/760 |
| 6,483,714 | B1 | * | 11/2002 | Kabumoto et al. | 361/760 |

FOREIGN PATENT DOCUMENTS

| JP | 59-111385 | 6/1984 |
| JP | 11-163499 | 6/1999 |

* cited by examiner

*Primary Examiner* — Tuan T Dinh
(74) *Attorney, Agent, or Firm* — Fitzpatrick, Cella, Harper & Scinto (57) ABSTRACT

An object of the present invention is to provide a wiring module that enables dense mounting and a reduction in wiring distance. The wiring module in accordance with the present invention includes a base material, a plurality of electronic circuit parts, insulating portions, and conductive portions connected to the electronic circuit parts, the plurality of electronic circuit parts, the insulating portions, and the conductive portions being integrally held on the base material. Wires are composed of a stack of the conductive portions and extend in a direction crossing a surface of the base material and in a direction crossing a direction perpendicular to the base material surface to electrically connect the plurality of electronic circuit parts together.

8 Claims, 10 Drawing Sheets

WIRING MODULE

BACKGROUND OF THE INVENTION

1. Field of the Invention

The present invention relates to methods for manufacturing wiring modules provided with electronic circuit parts used in electronic instruments, electric instruments, computers, communication instruments, and the like.

2. Description of the Related Arts

In general, wiring modules are produced by mounting semiconductors such as LSIs, various electronic circuit parts, and the like on a printed circuit board. These wiring modules are used in electronic instruments such as computers. Various printed circuit boards in which the electronic circuit parts are mounted are known, including those formed using ceramics, those formed using a composite material of a reinforcing material such as glass fibers and a synthetic resin such as an epoxy resin, and those formed using a flexible film such as a polyester resin or an aramid resin. With respect to the number of circuit layers on the same surface of a double-faced board or a single-faced board, the circuit boards are divided into those with a single layer and those with multiple layers. The printed circuit boards are adopted in accordance with applications or required characteristics. All these printed circuit boards have a conductor circuit. The circuit pattern of each of these circuit boards has an increased density owing to the reduced size of the instrument and the improved performance of semiconductors.

Proposals have been made of, for example, a method for manufacturing a printed circuit board and a method for forming a wiring board provided with electronic circuit parts, both using an applied ink jet technique. Japanese Patent Laid-Open No. 11-163499 stacks conductor layers on a base material to form a printed circuit board. According to Japanese Patent Laid-Open No. 59-111385, wiring is applied directly to parts arranged on a base material.

However, with both the manufacturing methods described in Japanese Patent Laid-Open Nos. 11-163499 and 59-111385 using the applied ink jet technique, various electronic circuit parts are two-dimensionally arranged on the base material. Thus, the mounting density of electronic circuit parts cannot be increased in accordance with the reduced size of the instrument to which the circuit board is applied and the improved performance and reduced sizes of semiconductor elements.

In special cases, semiconductor chips need to be densely arranged as in small-sized memory cards. Thus, a proposal has been made of a method for three-dimensionally arranging electronic circuit parts. However, the presently proposed method for three-dimensionally arranging electronic circuit parts is effective only for stacking of a plurality of electronic circuit parts of the same shape such as memory chips. Disadvantageously, this method also increases mounting costs. Thus, the application of the conventional mounting methods is severely limited.

SUMMARY OF THE INVENTION

An object of the present invention is to provide a method for manufacturing an electronic circuit part module which method enables dense mounting and a reduction in wiring distance.

To accomplish this object, the present invention has the following configuration.

A first aspect of the present invention is a wiring module comprising a base material, a plurality of electronic circuit parts, insulating portions, and conductive portions connected to the electronic circuit parts, the plurality of electronic circuit parts, the insulating portions, and the conductive portions being integrally held on the base material, wherein wires each comprise a stack of the conductive portions and extend in a direction crossing a surface of the base material and in a direction crossing a direction perpendicular to the base material surface to electrically connect the plurality of electronic circuit parts together.

A second aspect of the present invention is a wiring module comprising a base material, a plurality of electronic circuit parts each having connection terminals, insulating portions, and conductive portions connected to the electronic circuit parts, electronic circuit part, the insulating portions, and the conductive portions integrally held on a base material having connection terminals, wherein the connection terminals of each electronic circuit part and the connection terminal of the base material are electrically connected together by wires comprising a stack of the conductive portions, and wires each extend in a direction crossing a surface of the base material and in a direction crossing a direction perpendicular to the base material surface.

A third aspect of the present invention is an apparatus that manufactures a wiring module comprising a base material, a plurality of electronic circuit parts, insulating portions, conductive portions connected to the electronic circuit parts, the electronic circuit parts, insulating portions, and the conductive portions being integrally held on the base material, the apparatus comprising: means for arranging the electronic circuit parts; means for stacking wiring patterns having the conductive portions and the insulating portions to form a stack; and means for performing control such that the stacked conductive portions form wires extending in a direction crossing a surface of the base material and in a direction crossing a direction perpendicular to the base material surface.

A fourth aspect of the present invention is a method for manufacturing a wiring module comprising a base material, a plurality of electronic circuit parts, insulating portions, conductive portions connected to the electronic circuit parts, the electronic circuit parts, insulating portions, and the conductive portions being integrally held on the base material, the apparatus comprising: a step of arranging the electronic circuit parts; and a step of, in stacking wiring patterns having the conductive portions and the insulating portions, stacking a conductive portion formed on the circuit board and a following conductive portion in displacement from each other so that the conductive portions partly overlap, to form wires extending in a direction crossing a surface of the base material and in a direction crossing a direction perpendicular to the base material surface.

The present invention enables the wiring module to be manufactured using a reduced number of manufacturing steps. This enables a substantial reduction in the time and cost required for the manufacture and improves reliability. Further, electronic circuit parts can be freely arranged three-dimensionally in the wiring module and wires can be freely drawn. The arrangement density and wiring density of the electronic circuit parts can thus be increased. This contributes to increasing the speed of electronic circuit operations.

DESCRIPTION OF THE EMBODIMENTS

An embodiment of the present invention will be described with reference to the drawings.

(Wiring Module)

Figure 1:
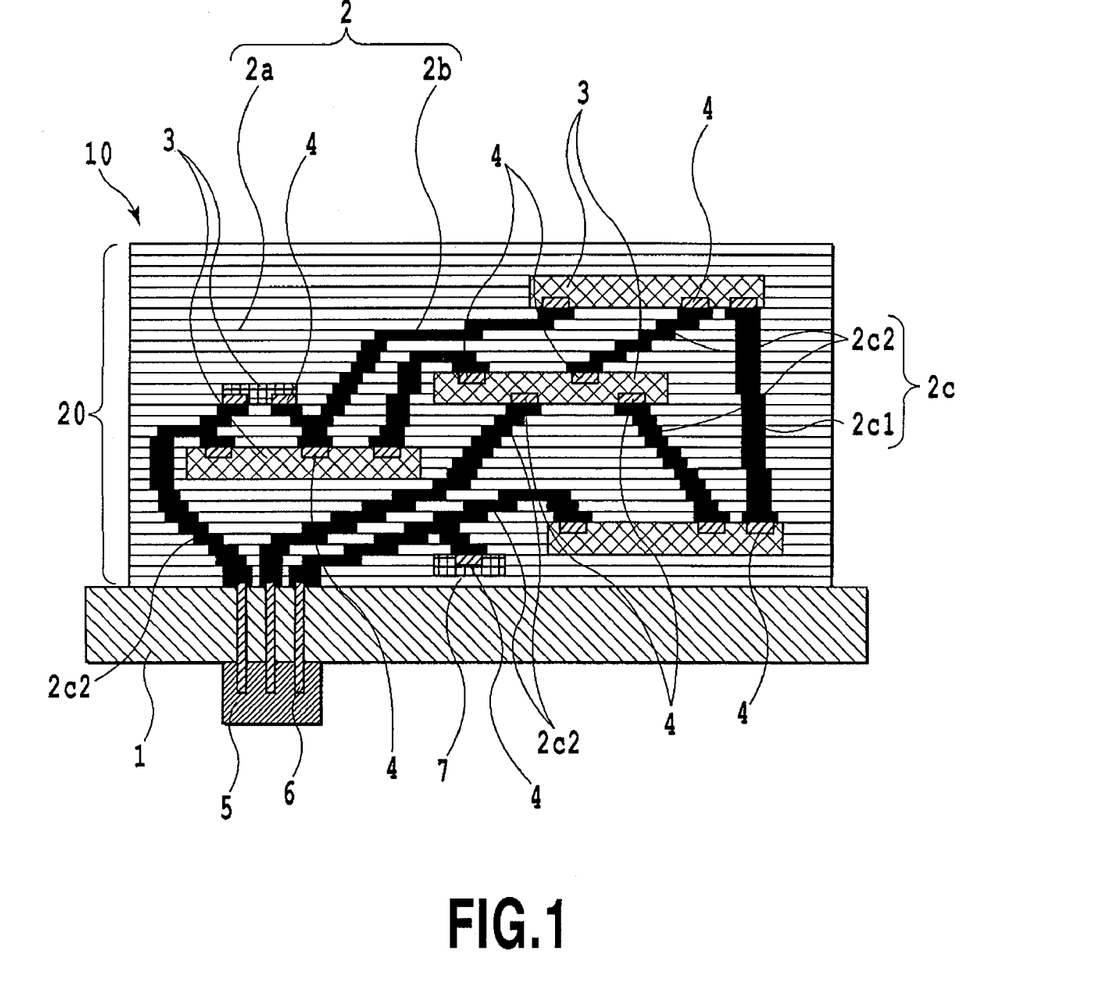
FIG. 1 is a vertical sectional side view showing a wiring module 10 in an embodiment.

FIG. 1 is a vertical sectional side view showing an example of a wiring module 10 formed in accordance with an embodiment of the present invention. A stack 20 having a plurality of stacked wiring patterns 2 is formed on a plate-like base material 1 composed of an insulating portion. The wiring pattern 2 is a layered structure composed of at least one of a conductive portion 2b or an insulating portion 2a. Electronic circuit parts 3 are held inside the stack 20 so as to constitute the wiring module 10. That is, in the wiring module 10, the wiring patterns 2 are filled into the space on the base material 1 except for the area in which the electronic circuit parts are arranged. The insulating portion 2a and the conductive portion 2b form a complementary pattern in a single layer of wiring pattern. In each wiring pattern 2, the insulating portion 2a and the conductive portion 2b have an almost equal thickness. The wiring patterns are formed to have a uniform thickness. The wiring portion is composed of stacked conductive portions to electrically connect the electronic circuit parts together.

A semiconductor integrated circuit as the electronic circuit part 3 has a connection terminal 4 connected to the conductive portion. Electronic circuit parts 7 other than the semiconductor integrated circuits, such as a resistor and a capacitor, may be placed on the base material. At least one of the electronic circuit parts placed on the base material preferably have a plurality of connection terminals. A plurality of connection terminals are more desirably arranged on at least two different outer surfaces of the electronic circuit part; this increases the degree of freedom at which the wiring portions connected to the connection terminals are drawn. The electronic circuit parts 3 and 7 are arranged at free positions in the wiring module 10 in accordance with the present embodiment without being restricted by a stacking position in a height direction or a horizontal position (the direction parallel to a surface of the base material) relative to the base material surface. The wiring patterns 2 are filled around the periphery of the electronic circuit part 3 to hold the electronic circuit part 3 in position.

Thus, the electronic circuit part 3 is surrounded by the wiring patterns 2, having a sufficient volume. Accordingly, selection of a heat conductive material for the wiring patterns 2 enables heat generated by the electronic circuit part to be effectively released. This is particularly effective on the semiconductor integrated circuit 3, which needs to appropriately radiate heat.

The connector 5 as a connection terminal is fixed to the base material 1 to electrically connect the wiring module 10 to an external device. The connector 5 also has a conductor terminal 6. The terminal 6 penetrates the base material 1 to project from its top and bottom surfaces. One end of the terminal 6 is connected to the wire 2c and thus to the connection terminal of the electronic circuit part on the circuit board. The other end of the terminal 6 is connected to an external device. In this case, the wires extend in a direction crossing the base material surface and in the direction crossing the direction perpendicular to the base material surface. This enables the wires to be freely drawn.

In the wiring module 10, the connection terminals 4 and 6 of the electronic circuit parts including the semiconductor integrated circuits 3 are electrically connected together by three-dimensionally inclined wires 2c1 and 2c2. FIG. 1 shows only the wires 2c1 and 2c2 in one cross section, but the connection terminals of the electronic circuit parts in another cross section are similarly connected together by three-dimensionally inclined wires.

The three-dimensionally inclined wires 2c1 and 2c2 are composed of stacked conductive portions to connect together the electronic circuit parts located at different height positions relative to the base material 1. In this case, the wires are formed in the direction crossing the base material surface and in the direction crossing the direction perpendicular to the base material surface. The wires may be formed by sequentially displacing the two-dimensional pattern positions of layers of the conductive portions 2b which are vertically adjacent to each other relative to the base material surface. That is, a conductive portion formed on the circuit board and a following conductive portion are stacked in displacement from each other so as to partly overlap to form a three-dimensionally inclined wire extending in the direction crossing the base material surface and in the direction crossing the direction perpendicular to the base material surface. Of course, the substantially vertical wires 2c1 can be obtained by forming layers of the conductive portions 2b which are vertically adjacent to each other relative to the base material surface, at the same position on the two-dimensional pattern. In the description below, when the wires 2c1 and 2c2 need not particularly be distinguished from each other, they are collectively denoted by reference numeral 2c.

Thus, the connection terminals 4 of the electronic circuit parts 3 and 7 and the connection terminals 6 of the connector 5 can be freely connected together by appropriately combining the three-dimensionally inclined wires 2c. This enables the connection terminals to be connected together by the most direct way in accordance with the arrangement of the connection terminals.

Figure 9:
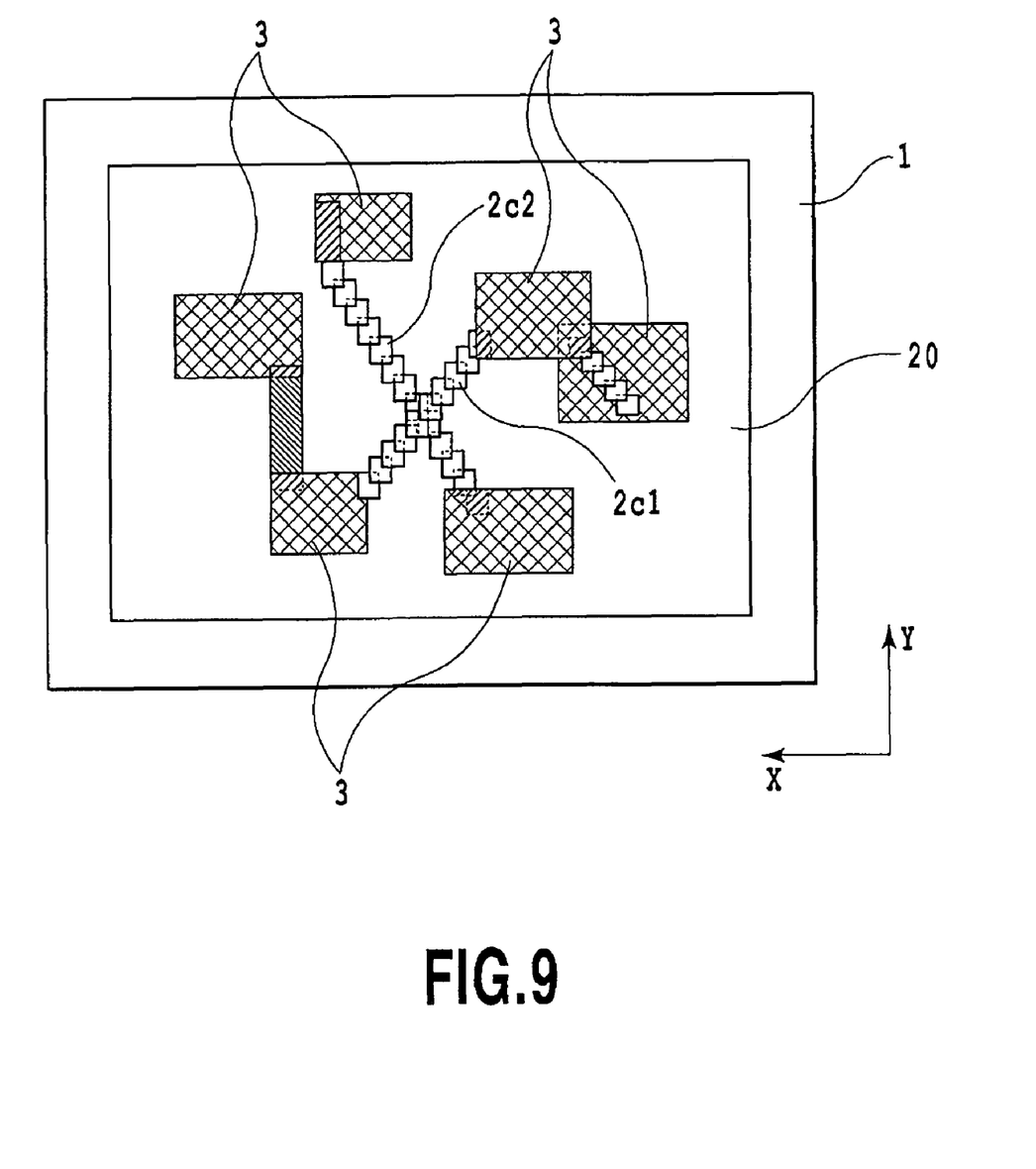
FIG. 9 is a plan view showing the arrangement of electronic circuit parts and wiring in a wiring module in accordance with an embodiment of the present invention.
Figure 10:
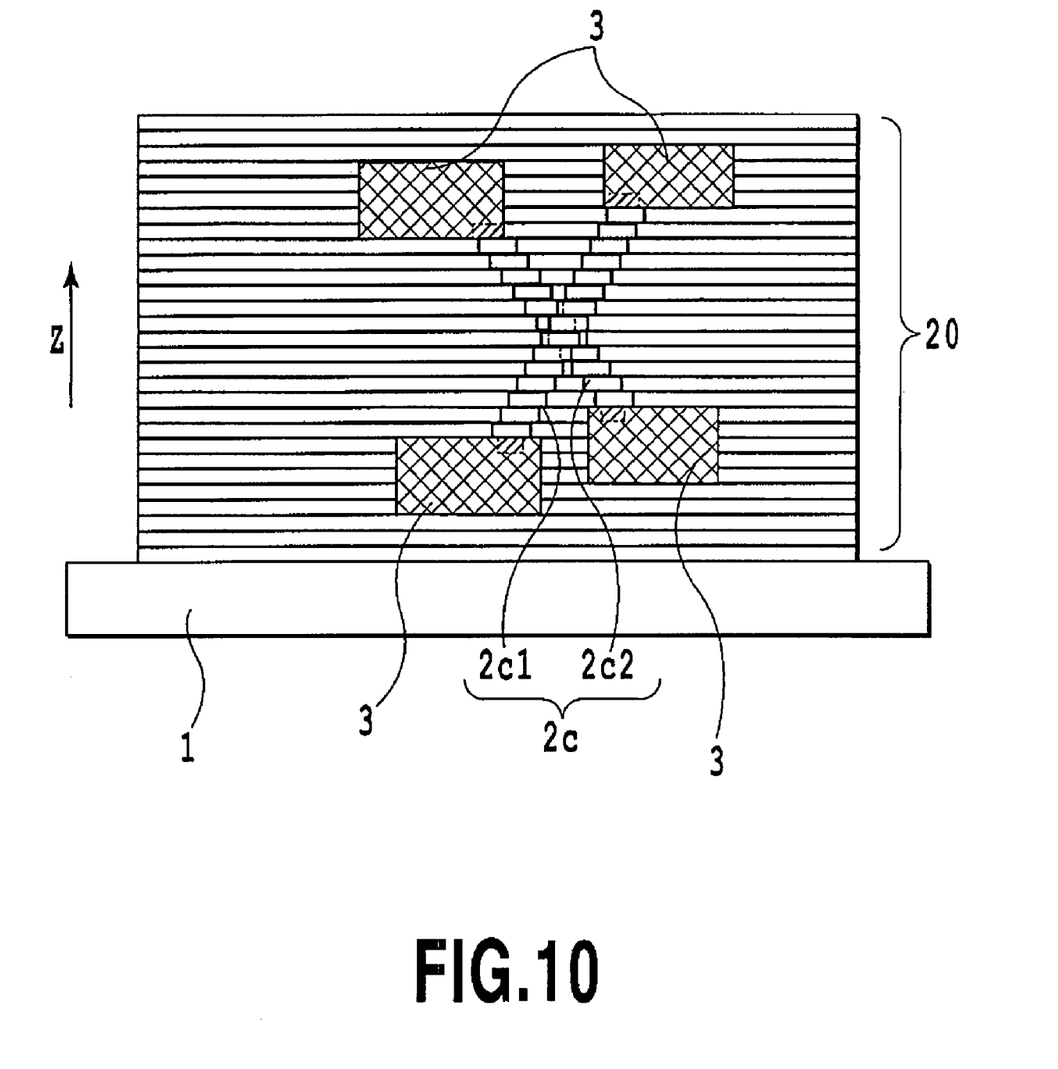
FIG. 10 is a side view showing the arrangement of electronic circuit parts and wiring in a wiring module in accordance with an embodiment of the present invention.

With reference to FIGS. 9 and 10, description will be given of an example in which the wiring module 10 has a plurality of three-dimensionally inclined wires (which extend in the direction crossing the base material surface and in the direction crossing the direction perpendicular to the base material surface). FIG. 9 shows a projection view of the wiring module in which the wires 2c and electronic circuit parts are projected on the surface of the base material 1. Although in the projection view, the plurality of wires 2c appear to cross each other, the wire 2c1 passes over the wire 2c2. Accordingly, the wires 2c1 and 2c1 are separated from each other in the vertical direction; the wires 2c1 and 2c2 are not in contact with each other and are thus electrically insulated from each other.

FIG. 10 shows a projection view of another embodiment as viewed from a side surface of the wiring module, in which the wires 2c and electronic circuit parts are projected on a side surface of the circuit board (the surface perpendicular to the surface of the circuit board 1). Although in the side perspective view, the plurality of wires 2c cross each other, the wires 2c are located in front of the wires 2c1 in the drawing. Accordingly, the wires 2c1 and 2c1 are separated from each other parallel to the circuit board and electrically insulated from each other.

Further, in a combination of the embodiments in FIGS. 9 and 10, the plurality of wires cross each other both in the perspective view in which the wires are projected on the surface of the circuit board and in the projection view in which the wires are projected on the side surface of the circuit board. However, the wires are actually separated and electrically insulated from each other.

Further, if the wires in accordance with the present embodiment are curved or three-dimensionally inclined from the circuit board surface, the stack structure preferably has at least 5 layers, more desirably at least 10 layers. In this case, the wiring pattern in each layer preferably has a thickness of at least 1 µm and at most 4 µm. Such a stack structure allows the wires to be formed thinner and smoother, enabling more wires to be densely laid out among the electronic circuit parts so as to extend over the shortest distance.

The wiring pattern 2 in the present embodiment has a smaller layer thickness than the electronic circuit part including the semiconductor integrated circuit 3. A plurality of the wiring patterns fill the space corresponding to the thickness of each of the electronic circuit parts 3 and 7. Even if electronic circuit parts of different thicknesses are buried in the wiring module, they can be buried in the wiring module by varying the number of layers without varying the layer thickness. The semiconductor integrated circuit 3 is peripherally covered by the insulating portions 2a of the wiring pattern 2 except for the periphery of the connection terminal 4 so as to prevent possible unwanted short circuits.

Moreover, in the wiring module in accordance with the present embodiment, the wires can be freely drawn as described above and thus be formed to have free three-dimensional shapes as well as planar shapes or perpendicular shapes as described above. This prevents the arrangement postures of the electronic circuit parts mounted in the wiring module from being restricted by the arrangement positions of the connection terminals 4. For example, if the connection terminal 4 is conveniently set from the bottom surface of an integrated circuit when the integrated circuit is connected to another integrated circuit or the like, the semiconductor integrated circuit 3 to be connected to the connection terminal 4 can be turned upside down so that the connection terminals of the two semiconductor circuits 3 are located opposite each other. This makes it possible to simplify and shorten the wiring between the connection terminals between the integrated circuits 3.

Further, according to the present embodiment, connection terminals can be freely arranged when electronic circuit parts to be applied are designed and manufactured. That is, with the conventional semiconductor integrated circuit 3, the arrangement of the connection terminals 4 is restricted by drawing-out of leads through wire bonding. However, the semiconductor integrated circuit 3 used in the present embodiment can be designed and manufactured with priority given to the degree of integration without being restricted by the arrangement of the connection terminals 4 or the like. That is, any number of connection terminals 4 can be freely arranged at any position facing the exterior of semiconductor integrated circuit 3, for example, on the top or bottom surface of, in the periphery of or in the center of the semiconductor integrated circuit 3. For example, in the semiconductor integrated circuit shown at 3a1 in FIG. 1, the two connection terminals 4 are arranged on each of its appropriate outer surfaces, in this case, its top and bottom surfaces. This semiconductor integrated circuit can thus be appropriately wired.

In the above embodiment, the wiring module has the plurality of electronic circuit parts. However, since the point of the present embodiment is that the wires extend in the direction crossing the base material surface and in the direction crossing the direction perpendicular to the base material surface, the wiring module has only to have at least one electronic circuit part. That is, the present embodiment is also applicable to the case where the connection terminals (5, 6) of the base material are electrically connected to the connection terminals of the electronic circuit part located in the stack on the base material.

(Wiring Module Manufacturing Apparatus and Method Using the Wiring Module Manufacturing Apparatus)

Figure 2:
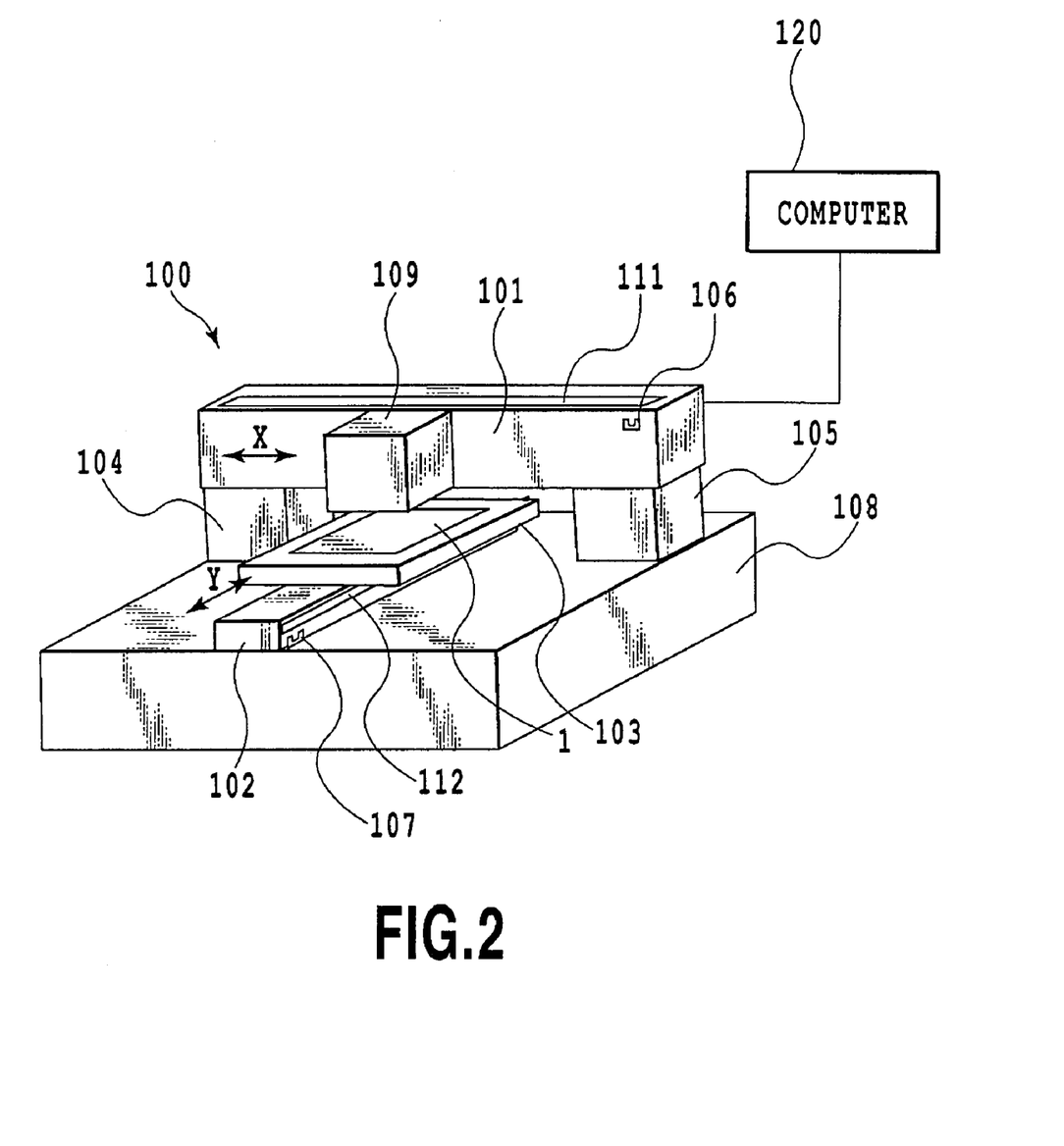
FIG. 2 is a perspective view showing the general configuration of a wiring module manufacturing apparatus in an embodiment.

FIG. 2 is a perspective view showing the general configuration of a wiring module manufacturing apparatus in accordance with an embodiment of the present invention. In FIG. 2, a carriage 109 can be reciprocated, by a CR (carriage) linear motor (carriage moving means) 101, on a stage (base material moving means) 103 provided with the base material 1, in a direction (X direction) orthogonal to a moving direction (Y direction) of the stage 103. That is, an LF motor 102 and the CR motor 101 constitute moving means for moving a liquid ejecting head 11 and the base material 1 relative to each other. The carriage 109 has two liquid ejecting heads 11 (see FIG. 3) that eject a conductive pattern solution and an insulating pattern solution onto the base material 1, respectively. The carriage 109 further has two tanks (not shown) from which the conductive pattern solution and insulating pattern solution are fed to the respective liquid ejection heads. The liquid ejecting heads 11 and the moving means constitute means for stacking a stack having the conductive portion and insulating portion as described below.

The LF (Line Feed) linear motor 102, the means for moving the stage 103, is very rigidly fixed to a level block 108. Thus, a surface of the stage 103, on which the base material 1 is placed, can be very accurately moved while remaining parallel to a surface of the level block even with the movement of the stage. The CR linear motor 101 is very rigidly held via bases 104 and 105 installed upright on the platen. The CR linear motor 101 allows the carriage 109 to move while remaining parallel to the platen surface, that is, the surface of the stage 103. The CR linear motor 101 and the LF linear motor 102 contain linear encoders 111 and 112 and origin sensors 106 and 107, respectively. Output signals from the origin sensors 106 and 107 and the linear encoders 111 and 112 are utilized as servo control inputs for movement by the linear motors. The output signal from the linear encoder 111 is also used to control timings for ejecting the conductive pattern solution and insulating pattern solution. Both linear encoders 111 and 112 have a high resolution of 0.5 µm, which is sufficient to form a circuit pattern of width about 10 µm.

A computer 120 is connected to the apparatus in accordance with the present embodiment and serves as a controller that controls the operation of the apparatus. On the basis of drawing data on circuit patterns sent by the computer 120 and detection signals from the linear encoders 111 and 112, and the like, the motors 101 and 102 and liquid ejecting heads are controlled to perform the following operation.

First, the computer 120 transmits drawing data to the apparatus 100. Then, the LF linear motor 102 drivingly moves the stage 103 holding the base material 1 to a predetermined drawing start position. Subsequently, the CR linear motor 101 drivingly starts scanning the carriage 109 over the base material 1. The liquid ejecting heads eject the conductive pattern solution and the insulating pattern solution. Once the carriage 109 finishes the first scan, a pattern corresponding to the width over which nozzles formed in the liquid ejecting heads are arranged is drawn on the base material 1. Subsequently, the CR linear motor 101 drivingly moves the base material 1 together with the stage by a distance corresponding to the arrangement width of the nozzles. Again, the CR linear motor 101 moves the carriage, while ejecting the solutions from the respective liquid ejecting heads for drawing. This drawing operation and movement of the base material 1 are repeated to form one layer of a wiring pattern composed of a conductive pattern and an insulating pattern, on the top surface of the base material 1. However, if the electronic circuit parts 3 are placed directly on the base material 1, the conductive pattern (conductive portion) and insulating pattern (insulating portion) are formed in the area other than the one in which the electronic circuit part 3 are arranged.

Subsequently, the operation of forming a wiring pattern as described above is repeated to stack a plurality of wiring patterns. A stack of thickness corresponding to the number of stacking operations is thus formed on the base material 1. Once the thickness of the stack 20 formed by the stacking step reaches a value indicating that electronic circuit parts should be placed in the stack, the staking operation is stopped and the electronic circuit parts are placed in the uppermost portion of the stack using a parts arranging apparatus (not shown). Subsequently, an operation of forming a wiring pattern is repeated in the space except for the area in which the electronic circuit parts are present.

These operations mount, on the base material 1, a plurality of electronic circuit parts 3 and a stack 20 composed of wires 2c connecting the electronic circuit parts together and insulating portions 2a as shown in FIG. 1.

In the present embodiment, a heater (not shown) is buried in the stage 103, which supports the base material 1. Accordingly, heat from the heater makes it possible to facilitate fixation of drawn circuit patterns.

Further, as the conductive pattern solution (conductive solution), Al, Ag, SnO$_2$, or the like, which contains metal colloids, is commonly used in view of their conductivity. The metal colloids preferably have a particle size of several 10 s of to several hundred nm in view of uniformity and stability of circuit patterns and the like. The insulating pattern solution preferably contains insulating particulates such as silica, alumina, calcium carbonate, or magnesium carbonate. However, the material is not particularly limited provided that the solution finally exhibits an insulating property. The above materials all have a high thermal conductivity, enabling heat generated by the electronic circuit parts to be effectively emitted.

On the other hand, examples of material of the base material 1 include ceramic obtained by sintering alumina, silica, aluminum nitride, barium titanate, or zirconia, a resin film mainly composed of polyolefin or an inorganic filler, or glass fiber-reinforced plastic. However, since the present embodiment executes the heater fixing step using the heater as described above and a sintering step described below, the base material 1 generally comprises a heat resistant material.

As described above, the apparatus 100 enables circuit patterns to be drawn and quickly fixed. This allows circuit patterns to be consecutively stacked on the fixed circuit patters to form a wiring module in a multilayer circuit base material. However, solvents contained in the solutions remain in the circuit patterns drawn by the apparatus 100; the metal colloids, which exhibit an conductive property, remain in the circuit patters as they are. Thus, to further improve the performance of the wiring module in terms of electric insulating property and conductivity, it is desirable to completely remove the solvents from the stack 20, formed by the apparatus 100, and to sinter the metal colloids to develop conductivity. Accordingly, the wiring module formed by the apparatus is desirably baked using a separate baking device. Of course, a baking process may be executed every time one layer of a pattern is formed.

As described above, the method for manufacturing a wiring module in accordance with the present embodiment exerts excellent effects as described below.

First, the present invention enables a wiring module to be inexpensively manufactured in a short time using a reduced number of manufacturing steps. That is, the present invention can solve the conventional problems such as the complicatedness of the circuit pattern forming step and the need for a large number of steps and a long time, as seen in wiring modules using conventional printed circuit boards. The present invention can eliminate the need for a large number of steps such as wire bonding and sealing of semiconductor electronic parts and their soldering to a printed base material. This makes it possible to improve reliability and to reduce costs.

The present invention further enables electronic circuit parts to be three-dimensionally arranged, allowing spatial restrictions to be avoided. This makes it possible to improve the use efficiency of spaces. Thus, electronic circuit parts can be densely mounted, and wiring distance can be reduced.

The present invention can also achieve the shortest wiring length, enabling an increase in the operating speed of an electronic circuit.

EXAMPLES

First Example

Now, with reference to FIGS. 3 to 6, a specific description will be given of a process of actually manufacturing a wiring module in accordance with the above embodiment.

Description will be given of an example in which the wiring module shown in FIG. 1 is manufactured by using the wiring module manufacturing apparatus 100, described with reference to FIG. 2, form wiring patterns 2 on the base material 1.

In this case, the base material 1 was a ceramics plate of thickness 2 mm mainly consisting of alumina, which offers an insulating property and a high heat resistance. The connector 5 is pre-fixed to the base material 1 to electrically connect the wiring module to an external device.

Figure 3:
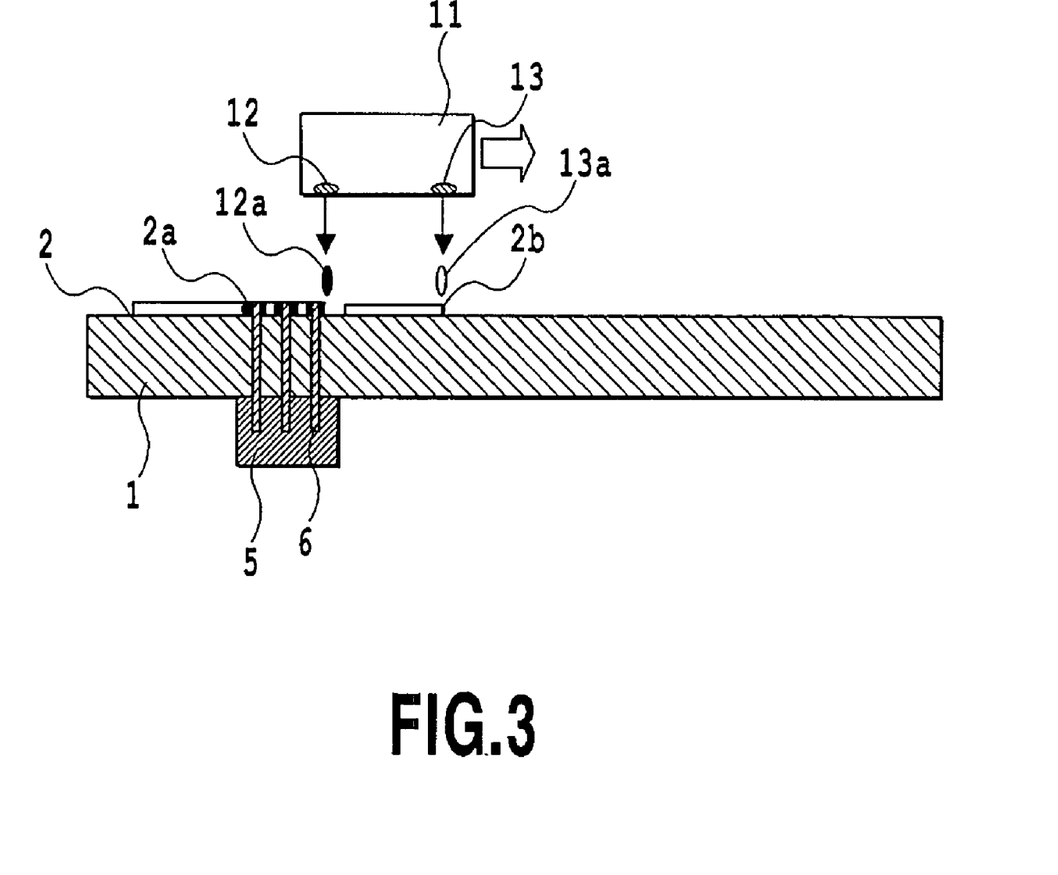
FIG. 3 is a vertical sectional side view showing a process of manufacturing a wiring module in a first example, in which a first layer of a wiring pattern is being formed on a base material.

FIG. 3 shows that a first layer of the wiring pattern 2 is being formed on the base material 1.

In the figure, reference numeral 11 denotes the liquid ejecting head mounted on the carriage 109. The liquid ejecting head 11 has a plurality of nozzles 12 (first ejecting portions) 12 from which the insulating pattern solution (insulating solution) and a plurality of nozzles (second ejecting portions) 13 from which the conductive pattern solution is ejected; the nozzles are arranged in a direction orthogonal to the sheet of the drawing. As shown in FIG. 3, as the liquid ejecting head 11 scans in the direction of an arrow in the figure, droplets 12a and 13a of the solutions are ejected from the nozzles 12 and 13 to form a conductive portion 2a and an insulating portion 2a together on the base material 1.

The conductive pattern solution used in this example contained copper powder as a conductor and a thermosetting epoxy resin as a binder. The insulating pattern solution comprised an epoxy resin-based solder resist.

The wiring module manufacturing apparatus 100 was used to form an insulating portion 2a and a conductive portion 2b on the base material 1 as a complementary pattern. If the solutions used are of a solution type or a thermosetting type, the solutions provided on the base material 1 are continuously passed through a heating furnace (not shown) to dry the solution and to harden the binder. With quick-drying solutions, the nozzles 12 and 13 in the liquid ejecting head 11 are used to consecutively form patterns. The wiring patterns had an almost uniform thickness of about 25 μm. The conductive pattern had a planar pattern width of 150 μm.

Figure 4:
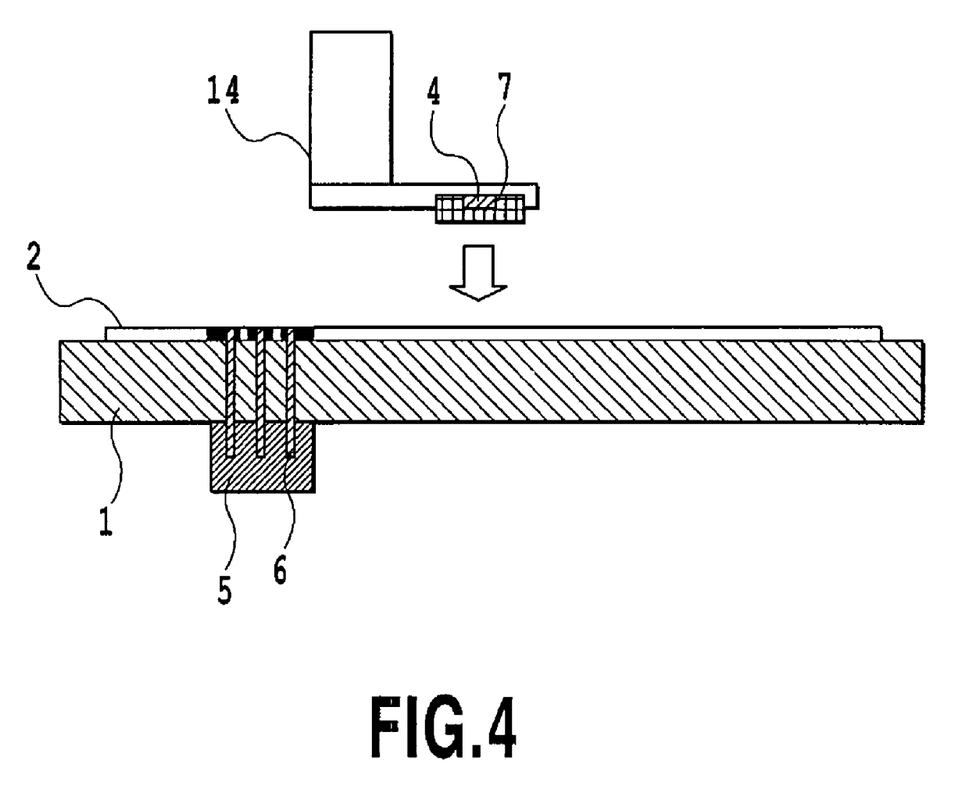
FIG. 4 is a vertical sectional side view showing the process of manufacturing a wiring module in the first example, in which electronic circuit parts are being mounted.

FIG. 4 shows a process of mounting the electronic circuit part 7 after the first layer of the wiring pattern 2 has been formed and partially hardened. In the figure, reference numeral 14 denotes a robot hand serving as a parts arranging device, which is means for arranging electronic circuit parts. The robot hand places the electronic circuit part 7 at a predetermined position in the uppermost wiring pattern 2 in the stack 2 formed on the base material 1.

Figure 5:
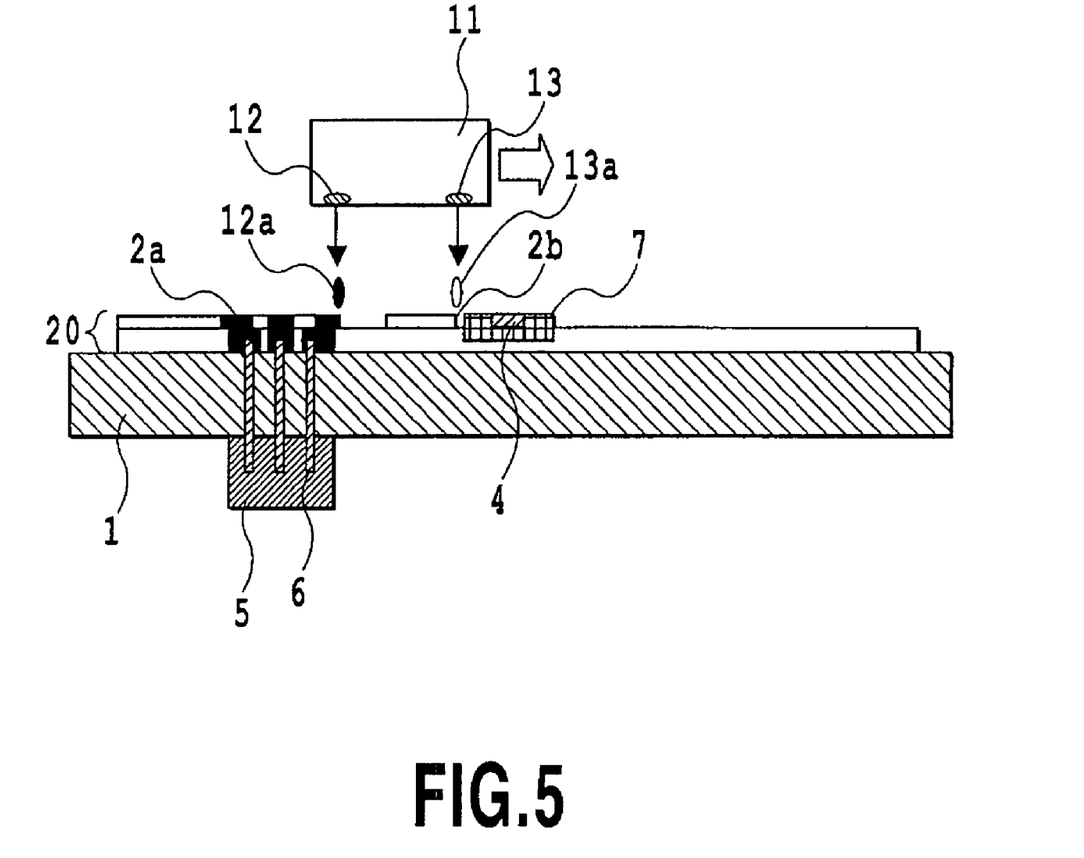
FIG. 5 is a vertical sectional side view showing the process of manufacturing a wiring module in the first example, in which wiring patterns are being sequentially formed in the space except for the area in which the electronic circuit parts are present.
Figure 6:
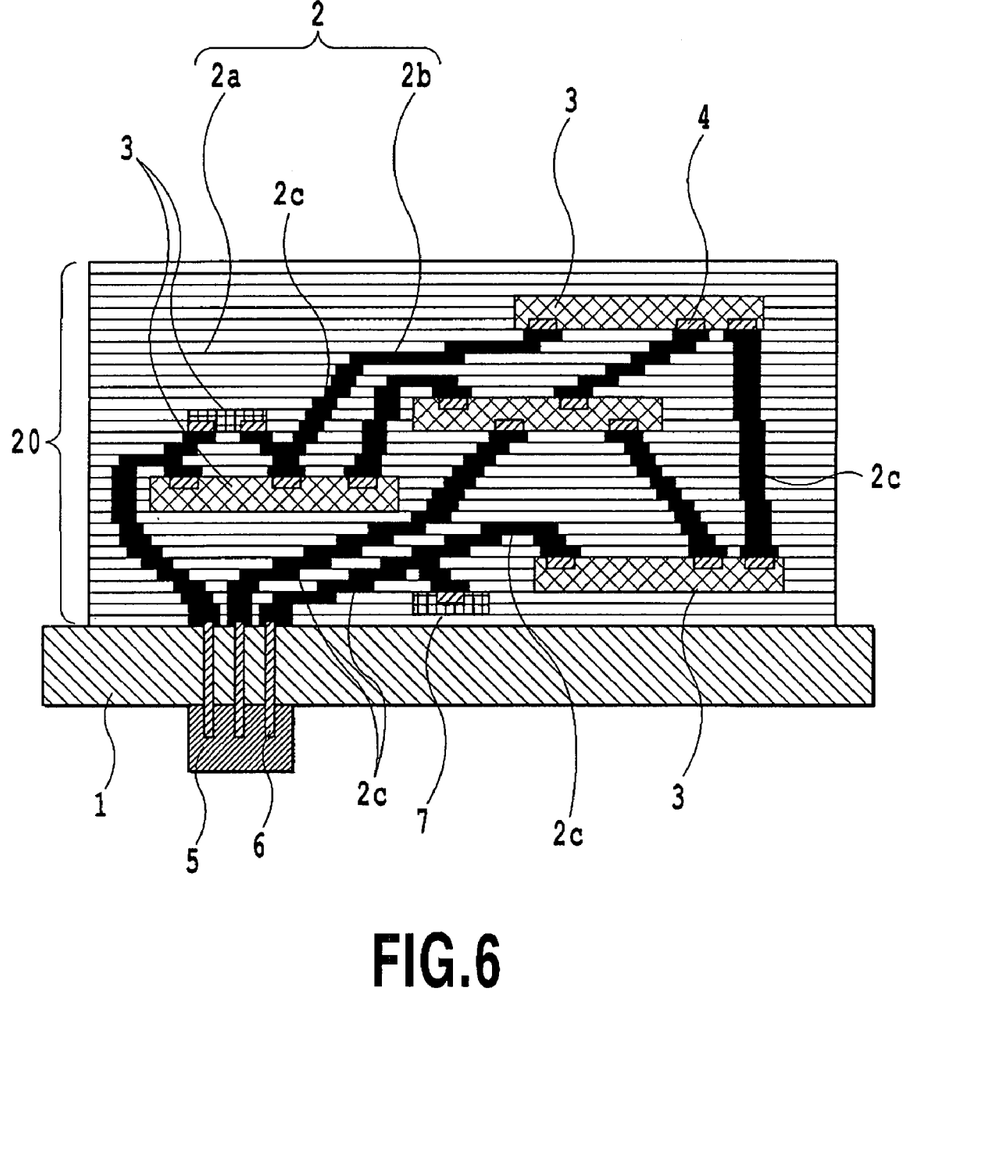
FIG. 6 is a vertical sectional side view showing the process of manufacturing a wiring module in the first example, in which a stack has been completed.

Then, as shown in FIG. 5, the wiring module arranging apparatus 100 in FIG. 2 is user to sequentially form wiring patterns 2 in the space except for the area in which the electronic circuit part 7 is located, to fill the periphery of the electronic circuit part 7. After the periphery of the electronic circuit part 7 is filled, the semiconductor integrated circuit 3a is placed by the robot hand 14. Again, wiring patterns 2 are stacked around the semiconductor integrated circuit 3 as an electronic circuit part. Subsequently, the formation of wiring patterns 2 and the placement of an electronic circuit part are similarly sequentially repeated to finally form a stack 20 as shown in FIG. 6. As shown in FIG. 6, the connection terminals 4 and 6 of the electronic circuit parts 3, 7, and 5 are connected together by the three-dimensional wires 2b. Finally, a baking process is executed in the heating furnace at 100 to 150° C. to dry the solvents, harden the binder, and develop conductivity. As a result, a wiring module 10 having desired electric circuit characteristics is obtained.

Second Example

Now, a second example of the present invention will be described with reference to FIGS. 7 and 8.

In the second example, a wiring module is manufactured by forming wiring patterns on a flexible temporary base material 15 that is different from the base material 1, finally formed into a wiring module, and then transferring the wiring patterns to the base material 1.

Figure 7:
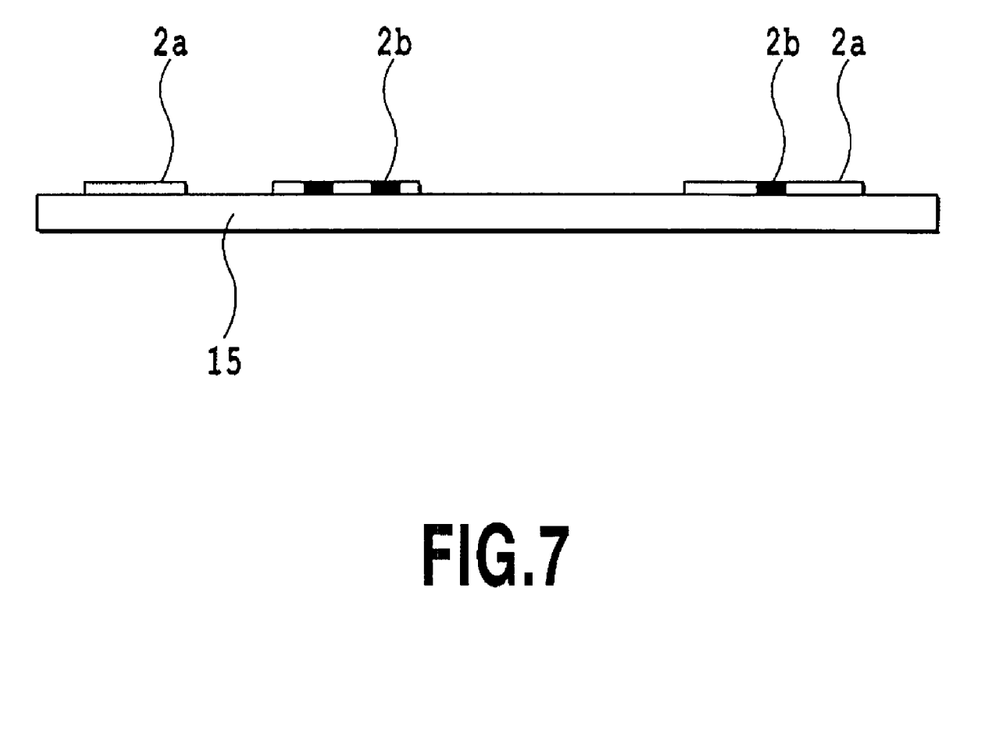
FIG. 7 is a vertical sectional side view showing a process of manufacturing a wiring module in a second example, in which a wiring pattern has been formed on a temporary base material.

FIG. 7 shows that a layer forming step has been executed to form wiring patterns 2 on the temporary base material 15. The temporary base material 15 was a polyimide film of thickness 100 μm, which is flexible and offers a high heat resistance. Wiring patterns 2 were formed on the temporary base material 15 using the wiring module manufacturing apparatus 100, described with reference to FIG. 2, as is the case with the first example. FIG. 7 shows that one layer of the wiring pattern 2 has been formed on the temporary base material 15. However, plural layers of the wiring pattern 2 may be formed on the temporary base material 15. However, in either case, the wiring patterns 2 may be formed in the space except for the position at which the electronic circuit part is locate, as is the case with the first example.

Figure 8:
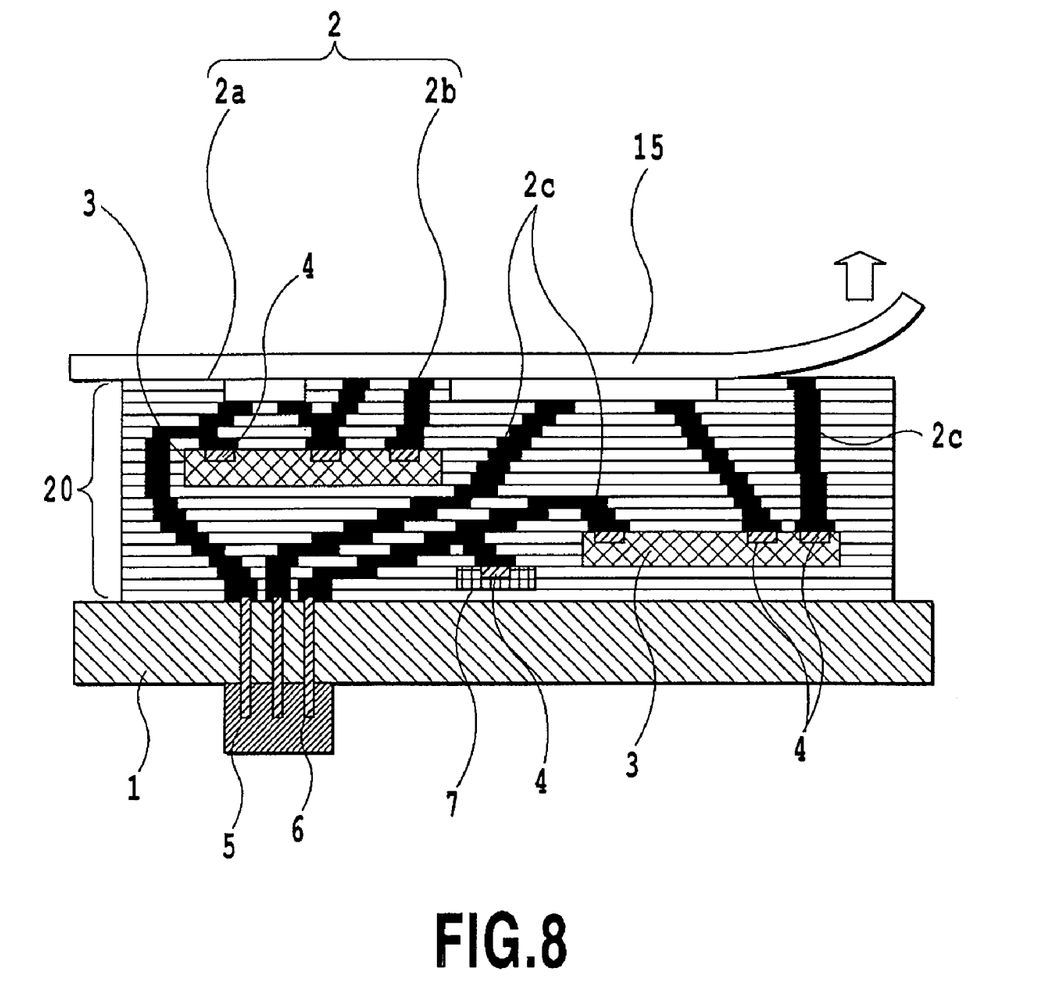
FIG. 8 is a vertical sectional side view showing the process of manufacturing a wiring module in the second example, in which the wiring pattern formed on the temporary base material is being transferred to the base material.

FIG. 8 is a diagram showing a transferring step. After the wiring patterns 2 formed on the temporary base material 15 are temporarily dried using the heating furnace, only the temporary base material 15 is released. This allows the wiring patterns 2 to be transferred to the base material 1. Transfer means for executing a transfer step using the temporary base material 15 comprises a well-known transfer device used for a printing apparatus. The transfer step and layer forming step are repeated to form a space (placement area) in the stack 20 transferred to the base material 1; the preset electronic circuit part 3 is to be placed in the space. Then, once the placement area reaches a height sufficient to accommodate the entire electronic circuit part, the robot hand places the electronic circuit part in the placement area.

Thus, the following operations are repeated: the formation of wiring patterns 2 on the temporary base material 15, the transfer of the wiring patterns 2 to the base material 1, and the placement of an electronic circuit part in the placement area formed in the stack 20. In this case, the placement of the electronic circuit part in the placement area may be followed by the formation of a wiring pattern and the electric connection of the connection terminals of the electronic circuit part to the wires or the formation of a wiring pattern may be followed by the placement of the electronic circuit part and the electric connection of the connection terminals of the electronic circuit part to the wires. The easier one of the above connection methods may be selected depending on the positional relationship between the connection terminals of the electronic circuit part and the wires. This enables conductor wiring layers 2 to be sequentially formed on the base material 1 as is the case with the first example. Further, in the second example, the wiring patterns formed on the temporary base material 15 during the transfer step are brought into pressure contact with the wiring patterns 2 already stacked on the base material 1. Thus, the pressure contact force effectively makes more uniform the thicknesses of the wiring patterns formed on the temporary base material 1.

After all the stacking steps are finished as described above, a baking process is finally executed in the heating furnace at 100 to 150° C. This results in drying of the solvents, hardening of the binder, and development of conductivity. As a result, a three-dimensional wiring module having desired circuit functions can be obtained.

Other Examples

In the above description, the driving forces of the LF (Line Feed) linear motor 102 and CR (carriage) linear motor 101 move the base material and the liquid ejecting head in respective direction orthogonal to each other. However, the present invention is not limited to this. With the liquid ejection head fixed, an X-Y stage may be used which moves the base material in an X direction and a Y direction crossing the X direction. In another configuration, with the base material fixed, the liquid ejecting head may be movable in two crossing directions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-130793, filed May 9, 2006, which is hereby incorporated by reference herein in its entirety.

What is claimed is:

1. A wiring module comprising:
    a base material;
    a stack comprising a plurality of layers each having a conductive area made of a conductive material and an insulating area made of an insulating material;
    a plurality of electronic circuit parts arranged in the stack and surrounded by the plurality of layers; and
    a connection terminal for connecting to an external device, the connection terminal passing through the base material,
    wherein the connection terminal and the plurality of electronic circuit parts are electrically connected to each other by a wire formed of the conductive areas of the plurality of layers, the conductive areas being stacked in contact with each other.

2. The wiring module according to claim 1, wherein each of the electronic circuit parts has a first surface parallel to a surface of the base material and a second surface opposite to the first surface, and has at least one connection terminal in either or both of the first surface and the second surface, the at least one connection terminal being used in contact with the conductive area of one of the plurality of layers for an electrical connection between the electronic circuit part and the wire.

3. The wiring module according to claim 1, wherein a thickness of each of the plurality of electronic circuit parts is an integral multiple of a thickness of the plurality of layers with respect to a direction in which the layers are stacked.

4. The wiring module according to claim 1, wherein a thickness of each of the plurality of layers is more than or equal to 1 µm and less than or equal to 4 µm with respect to a direction in which the plurality of layers are stacked.

5. The wiring module according to claim 1, wherein the plurality of the electronic circuit parts are arranged at different positions with respect to a direction in which the plurality of layers are stacked.

6. The wiring module according to claim 1, wherein one of the plurality of electronic circuit parts is a semiconductor integrated circuit.

7. The wiring module according to claim 1, wherein the conductive material contains Al, Ag, or SnO2, and the insulating material contains silica, alumina, calcium carbonate, or magnesium carbonate.

8. The wiring module according to claim 1, wherein the conductive area and the insulating area are formed by applying a conductive solution and an insulating solution on the base material and then executing a process of heating the solutions.

* * * * *